(12) United States Patent
Shi et al.

(10) Patent No.: US 9,362,173 B2
(45) Date of Patent: *Jun. 7, 2016

(54) METHOD FOR CHIP PACKAGE

(75) Inventors: Lei Shi, Jiangsu (CN); Yujuan Tao, Jiangsu (CN); Guohua Gao, Jiangsu (CN); Naomi Masuda, Jiangsu (CN); Koichi Meguro, Jiangsu (CN)

(73) Assignee: Nantong Fujitsu Microelectronics Co., Ltd., Nantong, Jiangsu (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/883,399

(22) PCT Filed: Oct. 18, 2011

(86) PCT No.: PCT/CN2011/080875
§ 371 (c)(1),
(2), (4) Date: May 3, 2013

(87) PCT Pub. No.: WO2012/059004
PCT Pub. Date: May 10, 2012

(65) Prior Publication Data
US 2013/0224910 A1   Aug. 29, 2013

(30) Foreign Application Priority Data
Nov. 5, 2010   (CN) .......................... 2010 1 0534406

(51) Int. Cl.
*H01L 21/78*   (2006.01)
*H01L 21/56*   (2006.01)
(Continued)

(52) U.S. Cl.
CPC ............ *H01L 21/78* (2013.01); *H01L 23/3178* (2013.01); *H01L 24/03* (2013.01);
(Continued)

(58) Field of Classification Search
CPC .......... H01L 2224/11013; H01L 2224/11019; H01L 2224/1182; H01L 2224/1191

USPC ................. 438/113, 114, 462, 465, 612–614; 257/737, 738, 778–781
See application file for complete search history.

(56) References Cited

U.S. PATENT DOCUMENTS 5,811,351 A * 9/1998 Kawakita et al. ............. 438/613
6,689,639 B2   2/2004 Sakuyama et al.
(Continued)

FOREIGN PATENT DOCUMENTS

CN   1420527 A   5/2003
CN   1949491 A   4/2007
(Continued)

OTHER PUBLICATIONS

Zhao et al., 'Threshold Pressure and its influence in chemical mechanical polishing for IC fabrication,' 1998 International Electron Devices Meeting, IEDM '98 Technical Digest, pp. 341-344.*
(Continued)

*Primary Examiner* — Bryan Junge
(74) *Attorney, Agent, or Firm* — Faegre Baker Daniels LLP

(57) ABSTRACT

Provided is a method for chip packaging, including the steps of: providing a semi-packaged wafer which has a cutting trail and a metal bonding pad of the chip; forming on the metal bonding pad a sub-ball metal electrode, using a selective formation process; forming a protective layer on the wafer in a region not including the sub-ball metal electrode, with the protective layer covering the cutting trail; forming a solder ball on the sub-ball metal electrode; dicing the wafer along the cutting trail. The present invention can prevent metal in the cutting trail from being affected during the production of the sub-ball metal electrode, and protect the lateral sides of a discrete chip after cutting. The process flow thereof is simple, and enhances the efficiency of the packaging as well as its yield.

17 Claims, 12 Drawing Sheets

(51) Int. Cl.
  *H01L 23/31* (2006.01)
  *H01L 23/00* (2006.01)
(52) U.S. Cl.
  CPC ............ *H01L 24/05* (2013.01); *H01L 24/94* (2013.01); *H01L 21/561* (2013.01); *H01L 23/3114* (2013.01); *H01L 24/11* (2013.01); *H01L 2224/0347* (2013.01); *H01L 2224/03462* (2013.01); *H01L 2224/0401* (2013.01); *H01L 2224/05022* (2013.01); *H01L 2224/05124* (2013.01); *H01L 2224/05147* (2013.01); *H01L 2224/05572* (2013.01); *H01L 2224/05644* (2013.01); *H01L 2224/05655* (2013.01); *H01L 2224/11849* (2013.01); *H01L 2224/131* (2013.01); *H01L 2224/94* (2013.01); *H01L 2924/0002* (2013.01); *H01L 2924/00013* (2013.01); *H01L 2924/00014* (2013.01); *H01L 2924/0103* (2013.01); *H01L 2924/014* (2013.01); *H01L 2924/01006* (2013.01); *H01L 2924/01013* (2013.01); *H01L 2924/01023* (2013.01); *H01L 2924/01024* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/01082* (2013.01); *H01L 2924/12042* (2013.01); *H01L 2924/15788* (2013.01)

(56) References Cited

U.S. PATENT DOCUMENTS

| | | | |
|---|---|---|---|
| 7,270,402 B2 * | 9/2007 | Sakaida et al. | 347/68 |
| 7,468,544 B2 | 12/2008 | Yang | |
| 7,495,332 B2 * | 2/2009 | Kariya et al. | 257/702 |
| 7,549,914 B2 * | 6/2009 | Ladjias | 451/533 |
| 7,566,944 B2 | 7/2009 | Wang et al. | |
| 7,645,514 B2 * | 1/2010 | Watanabe et al. | 428/416 |
| 7,727,877 B2 * | 6/2010 | Kang et al. | 438/614 |
| 7,838,424 B2 | 11/2010 | Karta et al. | |
| 7,888,236 B2 | 2/2011 | Pu et al. | |
| 8,314,495 B2 * | 11/2012 | Hayashi et al. | 257/773 |
| 2002/0001670 A1 | 1/2002 | Pauw et al. | |
| 2003/0104698 A1 | 6/2003 | Taniguchi et al. | |
| 2004/0164385 A1 | 8/2004 | Kado et al. | |
| 2008/0136026 A1 | 6/2008 | Yang | |
| 2008/0169477 A1 | 7/2008 | Wang et al. | |
| 2008/0191349 A1 * | 8/2008 | Aoki | 257/738 |
| 2008/0318413 A1 | 12/2008 | Fillion et al. | |
| 2009/0215227 A1 | 8/2009 | Tan et al. | |
| 2009/0283499 A1 | 11/2009 | Mayer et al. | |
| 2010/0173455 A1 * | 7/2010 | Shiota | 438/113 |

FOREIGN PATENT DOCUMENTS

| | | |
|---|---|---|
| CN | 101131915 A | 2/2008 |
| CN | 101197336 A | 6/2008 |
| CN | 101221939 A | 7/2008 |
| CN | 101290892 A | 10/2008 |
| CN | 101308813 A | 11/2008 |
| CN | 101339910 A | 1/2009 |
| CN | 101814445 A | 8/2010 |
| CN | 102034720 A | 4/2011 |
| CN | 102034721 A | 4/2011 |

OTHER PUBLICATIONS

International Search Report and Written Opinion issued by the State Intellectual Property Office, the P.R. China (in Chinese language) dated Dec. 31, 2011, for related International Application No. PCT/CN2011/080875; 10 pages.

English translation of the International Search Report issued by the State Intellectual Property Office, the P.R. China, dated Dec. 31, 2011, for related International Application No. PCT/CN2011/080875; 2 pages.

International Search Report and Written Opinion issued by the State Intellectual Property Office, the P.R. China (in Chinese language) dated Dec. 31, 2011, for related International Application No. PCT/CN2011/080874; 10 pages.

English translation of the International Search Report issued by the State Intellectual Property Office, the P.R. China, dated Dec. 31, 2011, for related International Application No. PCT/CN2011/080874; 2 pages.

English translation of the Written Opinion of the International Searching Authority, State Intellectual Property Office, the P.R. China, Dec. 31, 2011 (date of mailing Jan. 19, 2012), for related International Application No. PCT/CN2011/080874; 12 pages.

International Preliminary Report on Patentability (in Chinese language), The International Bureau of WIPO, dated May 7, 2013, for related International Application No. PCT/CN2011/080874; 8 pages. (includes cover page in English language).

English translation of the International Preliminary Report on Patentability, The International Bureau of WIPO, dated May 8, 2013, for related International Application No. PCT/CN2011/080874; 13 pages.

English translation of the Written Opinion of the International Searching Authority, State Intellectual Property Office, the P.R. China, Dec. 31, 2011 (date of mailing Feb. 16, 2012), for related International Application No. PCT/CN2011/080875; 13 pages.

International Preliminary Report on Patentability (in Chinese language), The International Bureau of WIPO, dated May 7, 2013, for related International Application No. PCT/CN2011/080875; 8 pages. (includes cover age in English language).

English translation of the International Preliminary Report on Patentability, The International Bureau of WIPO, dated May 8, 2013, for related International Application No. PCT/CN2011/080875; 14 pages.

* cited by examiner

METHOD FOR CHIP PACKAGE

CROSS REFERENCE TO RELATED APPLICATIONS

The present application claims priority to Chinese patent application No. 201010534406.X, filed on Nov. 5, 2010, and entitled "METHOD FOR CHIP PACKAGE", the entire disclosure of which is incorporated herein by reference.

TECHNICAL FIELD

The present disclosure generally relates to semiconductor technology, and more particularly, to a method for wafer level chip packaging.

BACKGROUND

Wafer Level Chip Size Packaging (WLCSP) is a technology in which a whole wafer is packaged and tested first, and then diced into individual chips. The size of a chip after being packaged is almost the same as that of a bare chip. Such a technology is totally different from conventional packaging technologies such as Ceramic Leadless Chip Carrier and Organic Leadless Chip Carrier, and satisfies the market's requirements for micro-electronic products, e.g., light in weight, small in size, thin in thickness and low in cost. Packaging with the WLCSP technology realizes high miniaturization, and the chip cost decreases significantly with the decrease of the chip size and the increase of the wafer size. The WLCSP technology, which, when being implemented, may take into account the IC design, wafer fabrication and packaging test in combination, is currently a hot point in the packaging field and becomes one of the development trends of the packaging technologies.

Chinese patent application No. 200610096807.5 discloses a method of wafer level chip size packaging, which mainly includes the following steps.

Referring to FIG. 1, bonding a semiconductor wafer 1 with a first glass substrate 2 having a same size as that of the semiconductor wafer 1. As such, devices formed on the wafer can be protected by the first glass substrate from environmental pollution and damage at initial packaging stage.

Referring to FIG. 2, thinning a back surface of the semiconductor wafer 1 which is opposite to the first glass substrate 2, and performing selectively etching on the back surface using photolithography and plasma etching processes, to form a first plurality of V-shaped grooves as dicing streets and to expose some of pads 11 (namely, chip electrodes).

Referring to FIG. 3, filling an insulating dielectric material into the first V-shaped grooves, and bonding a second glass substrate 3 and a solder mask 4 on the back surface of the semiconductor wafer 1. The second glass substrate 3 serves to support the semiconductor wafer 1, while the electric and heat insulation material of the solder mask 4 functions as a mechanical buffer to protect the semiconductor wafer 1 during subsequent mechanical cutting processes.

Referring to FIG. 4, half-cutting (not cutting through and separating the chip) where the first V-shaped grooves locates, to form a second plurality of V-shaped grooves as dicing streets, and to expose the pads 11 from sides of the second V-shaped grooves.

Referring to FIG. 5, forming an out wire 12 using an electroplating process, where one end of the out wire 12 is connected to a pad 11 in the second V-shaped grooves, and another end of the out wire 12 extends to the back surface of the wafer. Therefore, the electric function of the pad 11 may extend to the back surface of the wafer through the out wire 12.

Referring to FIG. 6, selectively forming an insulating protective layer 14, exposing a portion of the out wire 12, and form a soldered bump 15 on the exposed out wire 12. The wafer is then cut along the second V-shaped grooves to form a plurality of individual chips, which are then packaged. In this way, the total packaging process is finished.

However, the conventional method of wafer level chip size packaging has following disadvantages. During forming an out wire 12 using an electroplating process, metals in the dicing streets (the second V-shaped grooves as described above) are likely to detach from it, which may short out circuits. In addition, after being cut, the side of the individual chips, namely the side wall of the second V-shaped grooves, is exposed to external environments, which is likely to be damaged during outer skin packaging, which may break the out wire and further affect the chip's yield.

SUMMARY

The present disclosure provides a method for chip packaging to improve packaging efficient and yield.

The method may include: providing a semi-packaged wafer, the semi-packaged wafer having a dicing street and a metal pad; selectively forming a metal electrode on the metal pad; firming a protective layer in area outside the metal electrode on the wafer, the protective layer covering the dicing street; forming a solder ball on the metal electrode; and dicing the wafer along the dicing street.

In some embodiments, the selective forming process may be a selective electroplating process.

In some embodiments, the selective electroplating process may include: forming a first mask layer on the wafer, exposing an area the metal electrode to be formed; cleaning the wafer using zincate; with the first mask layer protection, electroplating nickel and gold successively on the wafer using a non-electrolytic electroplating process; and removing the first mask layer.

In some embodiments, the nickel may be electroplated to a thickness of 3 μm, and the gold may be electroplated to a thickness of 0.05 μm. The first mask layer may be a photoresist mask.

In some embodiments, the selective forming process may be a selective vapor deposition process.

In some embodiments, the selective vapor deposition process may include: providing a second mask on the wafer, exposing an area the metal electrode to be formed; with the second mask protection, depositing nickel and gold successively on the wafer using a physical vapor deposition process; and removing the second mask.

In some embodiments, the second mask may be a metal mask.

In some embodiments, the protective layer may have a thickness ranging from 5 μm to 50 μm. The protective layer may be made of thermosetting epoxy resin, which may be formed using a screen print process.

In some embodiments, the method may further include polishing the wafer surface after the protective layer is formed. A mechanical polishing may be employed, which may include: fixing the wafer on an operation table; winding a nonwovens with a hardness lower than the wafer around a polishing pad, the nonwovens facing the wafer surface closely; immersing the nonwovens into a polishing solution and polishing the wafer.

In some embodiments, the method may further include a plasma etching to remove the thermosetting epoxy resin covering the top surface of the metal electrode after the protective layer is formed.

In some embodiments, during a screen print process, the wafer's temperature is maintained lower than solidification temperature of the thermosetting epoxy resin. The solidification temperature of the thermosetting epoxy resin is lower than 200° C.

In some embodiments, the thermosetting epoxy resin may includes a solidified filler which may have a particle diameter less than one third of the thickness of the printing layer of the epoxy resin.

In some embodiments, the thermosetting epoxy resin is printed to 15 μm, the solidified filler has a particle diameter no more than 5 μm, and an average thickness of the protective layer formed by solidifying the epoxy resin ranges from 11 μm to 12 μm.

In some embodiments, before performing a screen print process, the wafer may be baked, or be treated using plasma for activating its surface.

Compared with the conventional technology, the present disclosure has the following advantages:

1. Using a selective forming process to form a metal electrode, metals in the dicing street may be avoided to detach from it or be adversely affected by the vapor deposition process during forming the metal electrode.

2. By forming a protective layer in area outside the metal electrode on the wafer, the protective layer covers the dicing street and are specifically made of thermosetting epoxy resin, the thermosetting epoxy resin may protect the side surface of the individual chips (side wall of the dicing street), especially metal wire formed therein, from being damaged, after the wafer is diced into individual chips.

3. Embodiments of the disclosure simply packaging processes with low cost, improving packing efficiency and packaging yield.

BRIEF DESCRIPTION OF THE DRAWINGS

The foregoing and other features, and advantages of the present disclosure will become more fully apparent from the following description and appended claims, taken in conjunction with the accompanying drawings. The same reference numerals are used to denote elements similar to that in the conventional art. Additionally, elements in the drawings are not drawn to scale, which helps understanding of embodiments of the present invention. For clarity, the dimensions of some layers and areas are exaggerated.

DETAILED DESCRIPTION

According to the conventional method of wafer level chip size packaging, metals in the dicing street are likely to detach from it during forming a metal electrode, which thereby may short out circuits. In addition, after being cut, the side of the individual chips is exposed to the external environment, which is likely to be damaged. The above problems can be solved in the present disclosure by employing a selective forming process to form a metal electrode, and forming a protective layer to cover the dicing street. Hereinafter, the disclosure will be described in detail with several embodiments in conjunction with the accompanying drawings.

Figure 1:
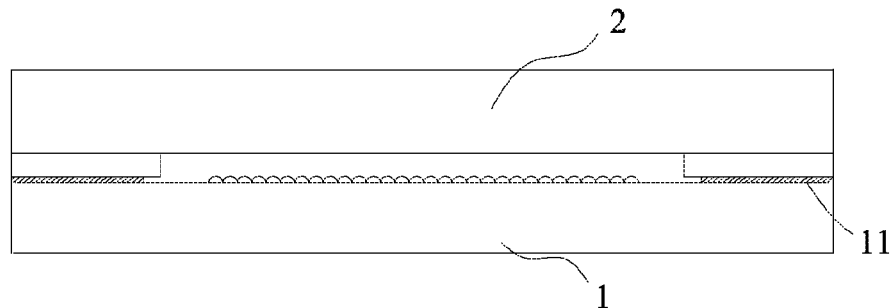
FIG. 1 to FIG. 6 schematically illustrate sectional views according to a conventional method of wafer level chip size packaging.
Figure 2:
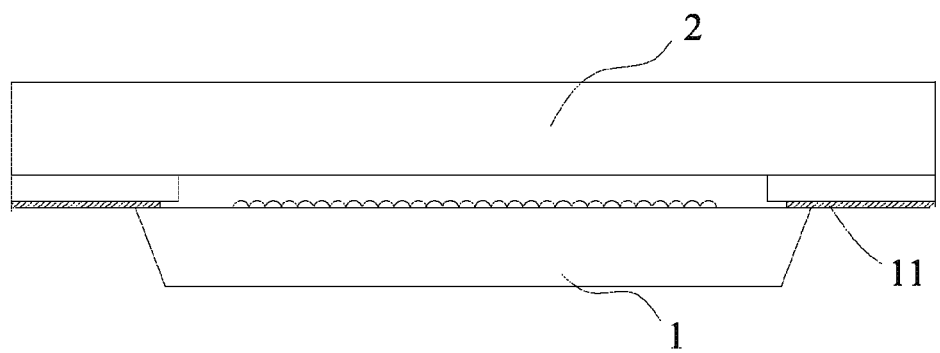
Figure 3:
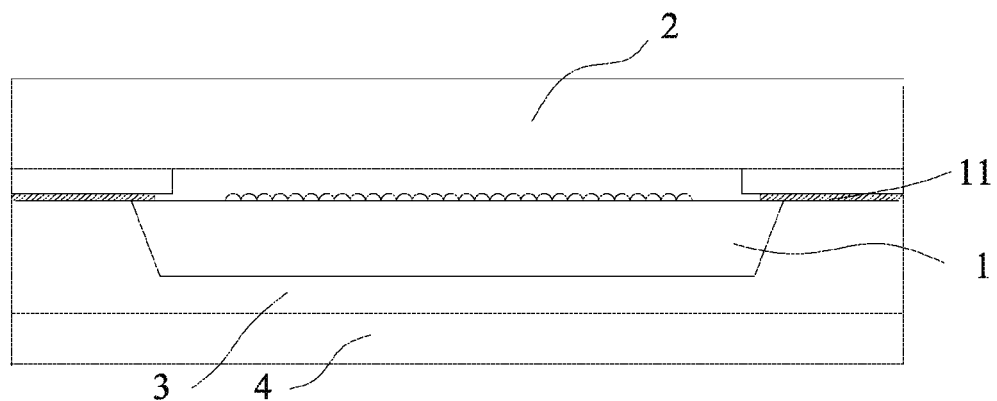
Figure 4:
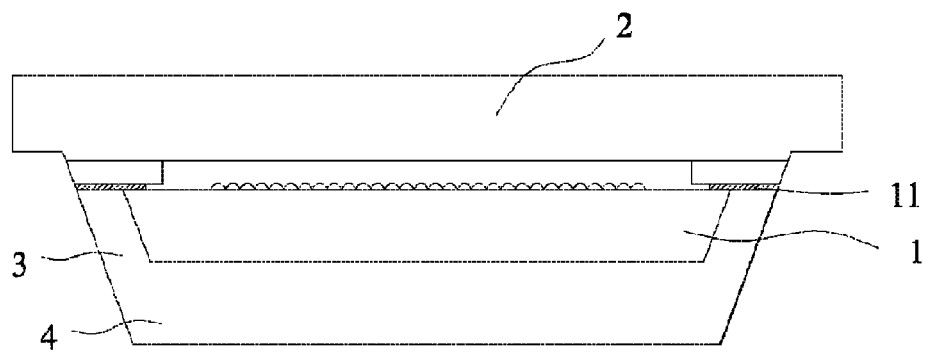
Figure 5:
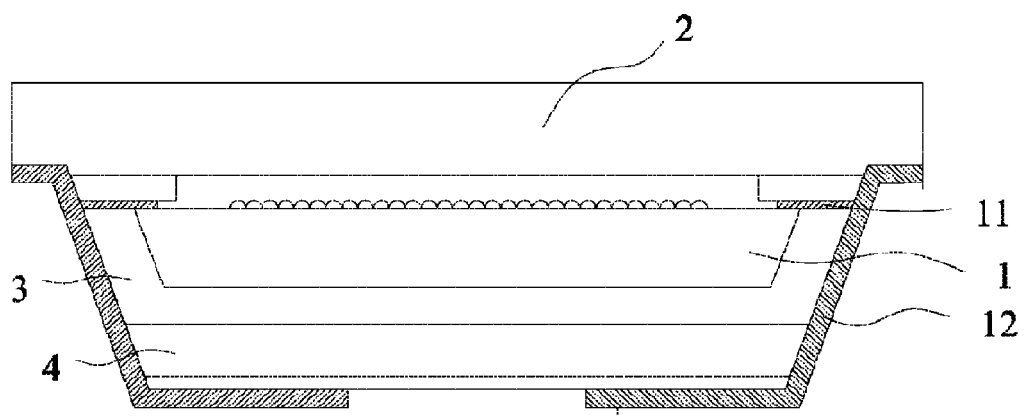
Figure 6:
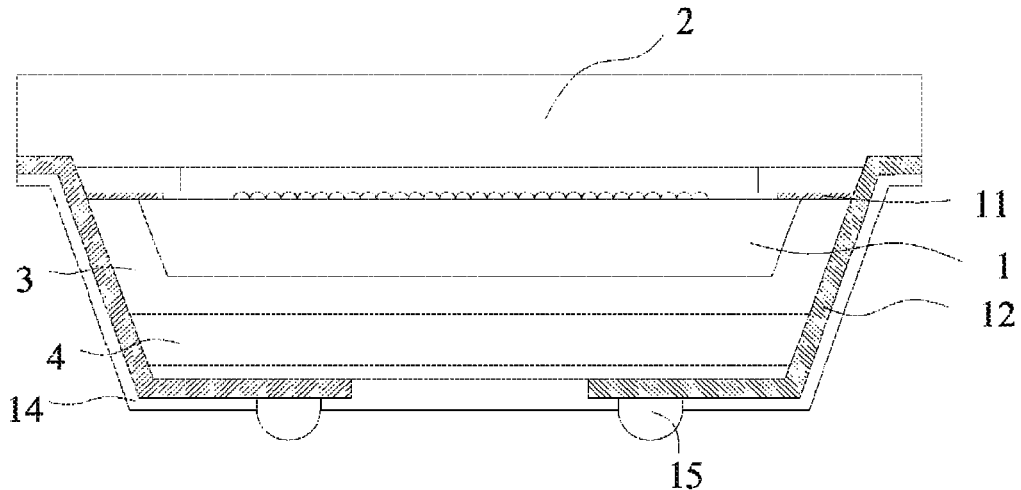
Figure 7:
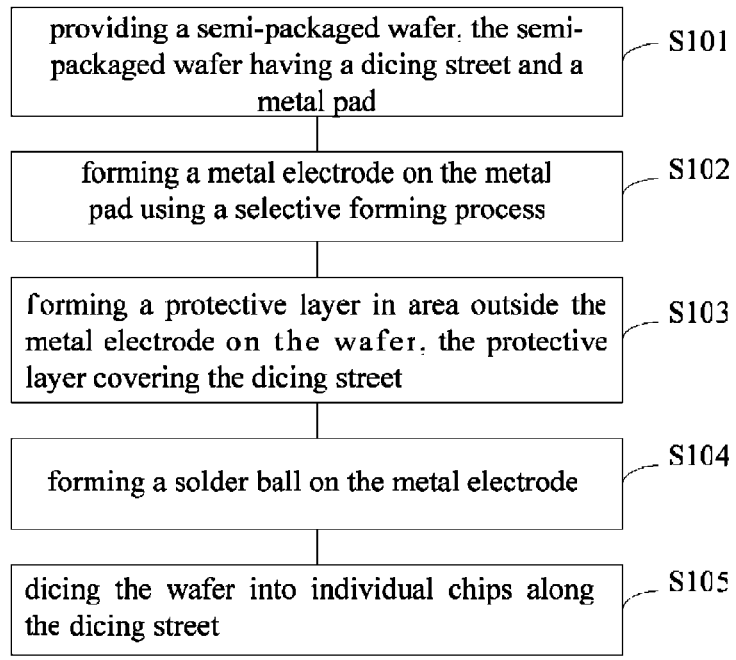
FIG. 7 schematically illustrates a flow chart of a packaging method according to embodiments of the present disclosure.

FIG. 7 schematically illustrates a flow chart of a packaging method according to embodiments of the present disclosure. The method may include: S101, providing a semi-packaged wafer. Specifically, the semi-packaged wafer may include: a semiconductor substrate with a chip formed thereon, a dicing street for dicing the wafer into a plurality of individual chips, a protective mask for insulating which is formed on the semiconductor substrate and has a plurality of openings, and a metal pad in which the chips are exposed from the openings. The protective mask may be an organic mask, e.g., polyimide and so on. The metal pad may include a common interconnecting metal, such as copper, aluminum.

In S102, forming a metal electrode on the metal pad using a selective forming process.

The above-mentioned selective forming process is able to avoid an adverse effect on the metal in the dicing street during forming the metal electrode. The selective forming process may include a selective electroplating process or a selective vapor deposition process.

In some embodiments, the selective electroplating process may include forming a photoresist mask on the wafer, then performing electroplating. Specifically, a non-electrolytic electroplating process may be used to improve uniformity of the electroplating and to form a thinner metal electrode. In some embodiments, the selective vapor deposition process may include forming a mask on the wafer, then performing vapor deposition. The mask may be a metal mask. The metal mask can be used repeatedly during packaging wafers in a same lot, which may decrease cost.

The material for the metal electrode may include nickel, gold, aluminum, titanium, tungsten, chromium, an alloy thereof, or combinations thereof. The material may be selected according to a thickness of the metal electrode to meet requirements of the process and cost.

In S103, forming a protective layer in area outside the metal electrode on the wafer, the protective layer covering the dicing street.

The protective layer is able to improve the protection effect on the wafer, especially, on the metal in the dicing street, so as to increase yield of the package. Specifically, a screen print process may be used to form the protective layer. In order to decrease complexity of manufacturing, the protective layer may employ a thermosetting resin, such as epoxy resin, phenolic resin, urea resin, melamine resin, unsaturated resin, polyurethane, polyimide, and so on. By setting an opening in a screen printing plate used in the screen print process, the location of forming the protective layer may be defined, for example, to make the protective layer form at least covering the dicing street.

After the formation of the protective layer, a polishing process may be used to process the wafer surface. In addition, a plasma etching process may be used to remove a part of protective layer which covers on the top surface of the metal electrode due to a liquidity of the thermosetting resin during screen printing, so as to expose the top surface of the metal electrode, which is convenient for subsequent process.

In S104, forming a solder ball on the metal electrode. A solder material may be firstly coated covering the top surface of the metal electrode. Then a high temperature reflux is performed to form the solder ball. The solder material may include tin, lead, silver, copper, zinc, an alloy thereof, or combinations thereof.

In S105, dicing the wafer into individual chips along the dicing street.

Generally, a blade with its width less than that of a dicing street may be used to dice the wafer mechanically. Or the wafer may be diced with a laser. The side surface and the top edge of the individual chips are covered by the protective layer, which can protect the metal wires formed thereon from being damaged. Then an outer skin packaging is performed to finish the packaging process of the present disclosure.

For more understanding advantages of the disclosure, two embodiments are described in detail in conjunction with the accompanying drawings.

First Embodiment

Figure 8:
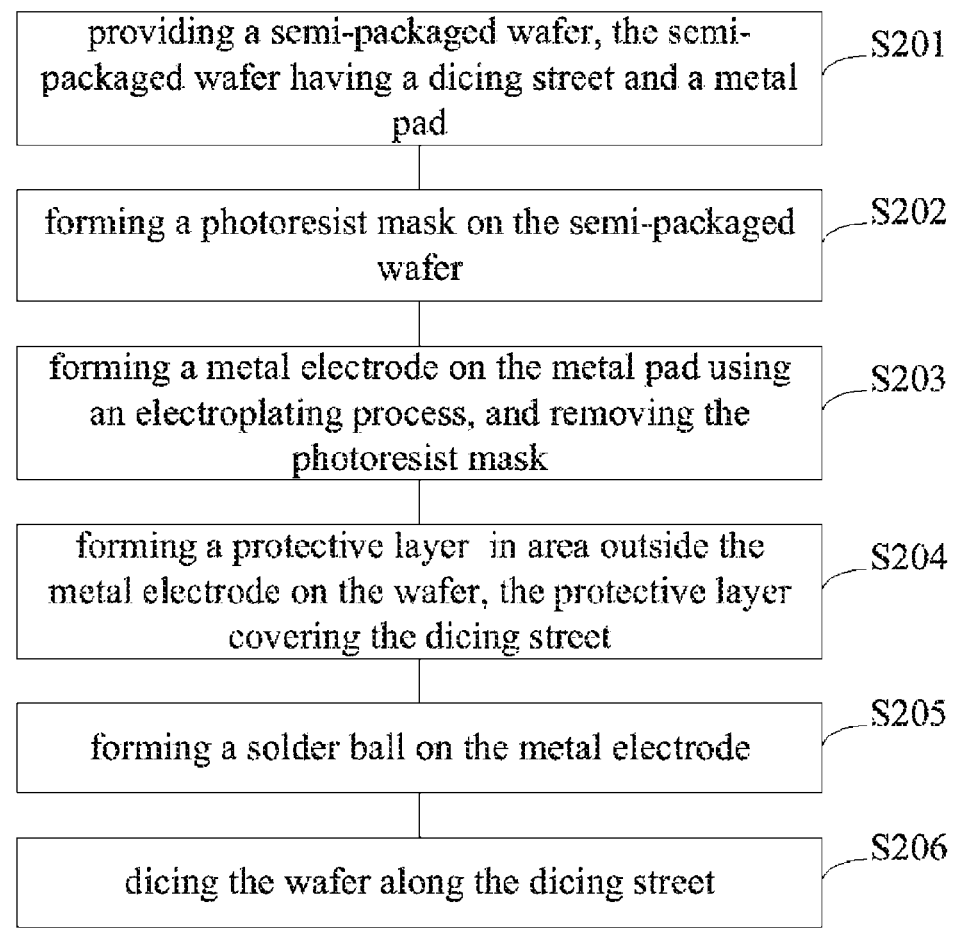
FIG. 8 schematically illustrates a flow chart according to a first embodiment of the present disclosure.

FIG. 8 schematically illustrates a flow chart according to the first embodiment of the present disclosure. FIG. 9 to FIG. 16 respectively schematically illustrate cross-sectional views of the steps shown in FIG. 8. Hereinafter, the first embodiment may be described in detail with reference to FIG. 8.

Referring to FIG. 8, step S201 is performed.

Figure 9:
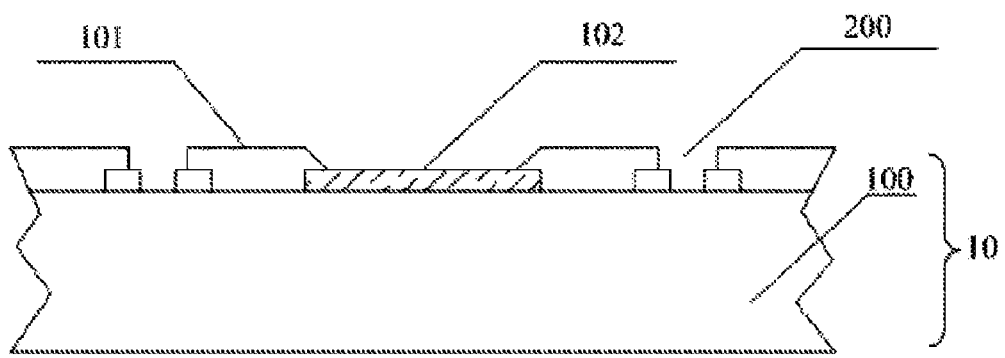
FIG. 9 and FIG. 11 to FIG. 21 respectively schematically illustrate cross-sectional views of the steps shown in FIG. 8.

Referring to FIG. 9, a semi-packaged wafer 10 is provided. Specifically, the semi-packaged wafer may include: a semiconductor substrate 100 with a chip formed thereon, a dicing street 200 for dicing the wafer into a plurality of individual chips, a protective mask 101 for insulating which is formed on the semiconductor substrate 100 and has an opening, and a metal pad 102 on the chip which is exposed from the opening. The protective mask 101 may be an organic mask, e.g., polyimide and so on. The metal pad 102 may include a common interconnecting metal, such as copper, aluminum.

It should be noted that the semiconductor substrate 100 may not be limited to a monatomic silicon substrate or a SOI (Silicon on Insulator) substrate, which may further include semiconductor devices, metal interconnections or other semiconductor structures formed thereon. The protective mask 101 may be formed covering the above semiconductor structures to protect the chip. The metal pad 102 serves as an electrode of the input/output terminal, to extend the electric function of the chip.

Figure 10:
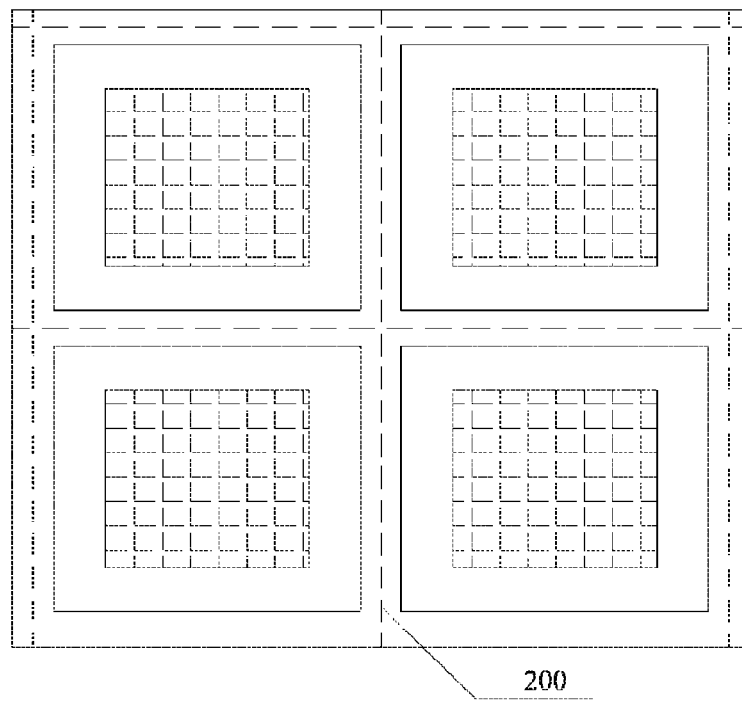
FIG. 10 schematically illustrates a top view of FIG. 9.

FIG. 10 schematically illustrates a top view of the semi-packaged wafer 10 above mentioned. Referring to FIG. 10, a grid-shaped dicing street 200 is formed on the wafer. The dicing street 200 divides the wafer into a plurality of square areas. Each square area represents an individual chip. The dicing street 200 may have a cross-section shape of isosceles trapezoid, which may not have a depth too greater so as not to affect the steel-type hardness of the wafer.

Referring to FIG. 8, step S202 is performed.

Figure 11:
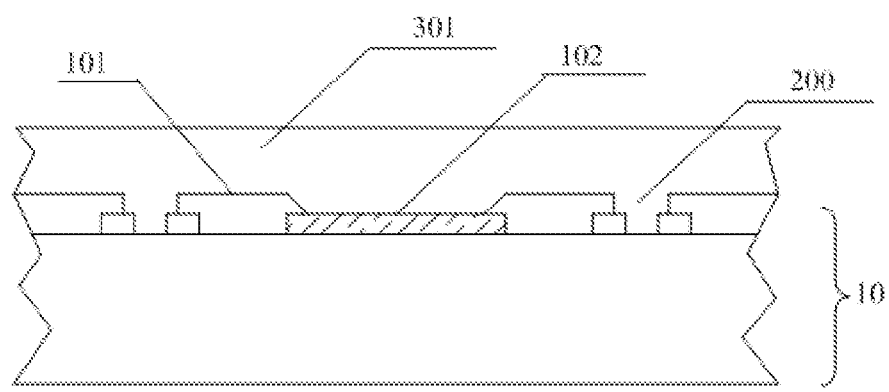

Referring to FIG. 11, a photoresist layer 301 is formed on the semi-packaged wafer 10.

The photoresist layer 301 may be a positive photoresist or a negative photoresist, which may be formed using a spinning coating or a spraying coating process. In some embodiments, a positive photoresist is used which covers the wafer uniformly using a spinning coating process. The photoresist may be formed to have a thickness ranging from 1 μm to 10 μm.

After the photoresist is formed, a prebaking process may be performed usually. For example, the prebaking process may be performed under vacuum, by heating at a temperature ranging from 85° C. to 120° C. for about 30 seconds to about 60 seconds, to remove the volatile organic solvent which is residual in the spinning coating or spraying coating process, to enhance a adhesive strength between the photoresist layer 301 and the underlying wafer, and to release stress in the photoresist.

Figure 12:
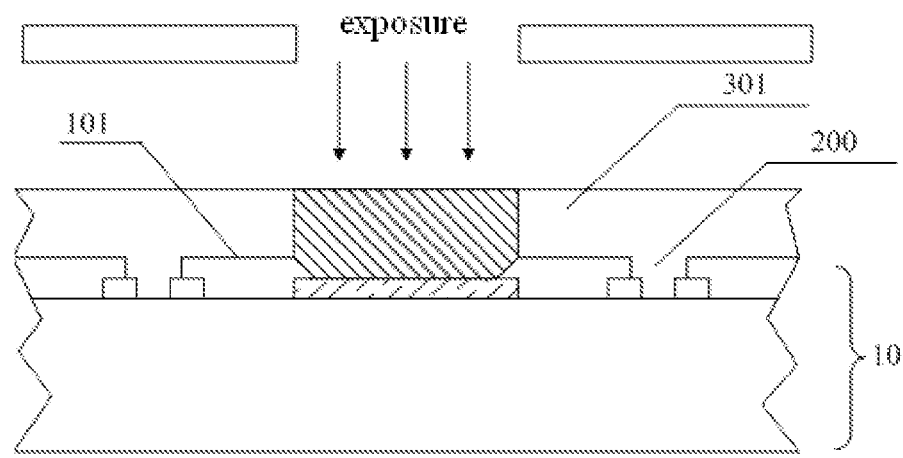

Referring to FIG. 12, the photoresist layer 301 is exposed using a photo mask, to transfer a pattern on the photo mask to the photoresist layer 301.

The pattern on the photo mask corresponds to the protective mask 101, so that the metal pad 102 where a metal electrode will be formed is exposed. In FIG. 12, the area marked with oblique lines represents the exposed area.

Generally, a post baking process may be performed after exposure. The post baking process may be performed under vacuum, by heating at a temperature ranging from 110° C. to 130° C. for about 30 seconds to about 60 seconds, to decrease standing wave effect.

Figure 13:
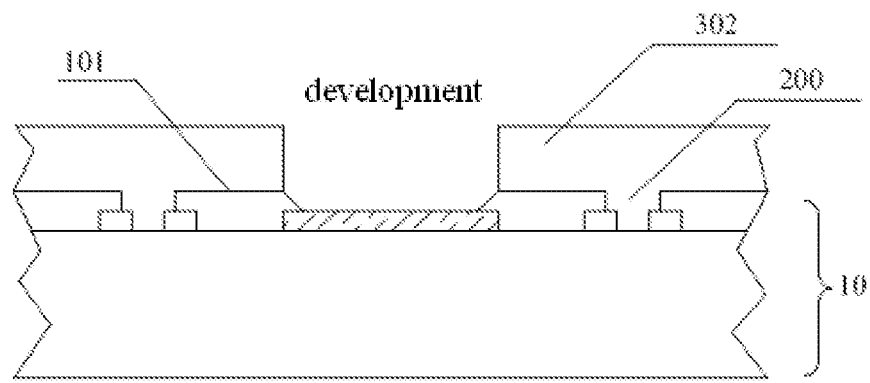

Referring to FIG. 13, the photoresist is developed, after being exposed, to form a photoresist mask 302.

Because the photoresist layer 301 used is a positive photoresist, a developing solution applicable for the positive photoresist is employed, such as tetramethylammonium hydroxide (TMAB). The wafer with the exposed photoresist formed thereon is immersed in the developing solution. The exposed photoresist layer 301 is then dissolved in the developing solution, to form the photoresist mask 302. Then, the wafer is taken out of the developing solution, and is washed using deionized water to remove the residual developing solution and photoresist particles. After washing, a hard baking may be performed to evaporate the residual organic solvent on the photoresist mask 302 and to harden the photoresist mask 302.

Referring to FIG. 8, step S203 is performed.

Figure 14:
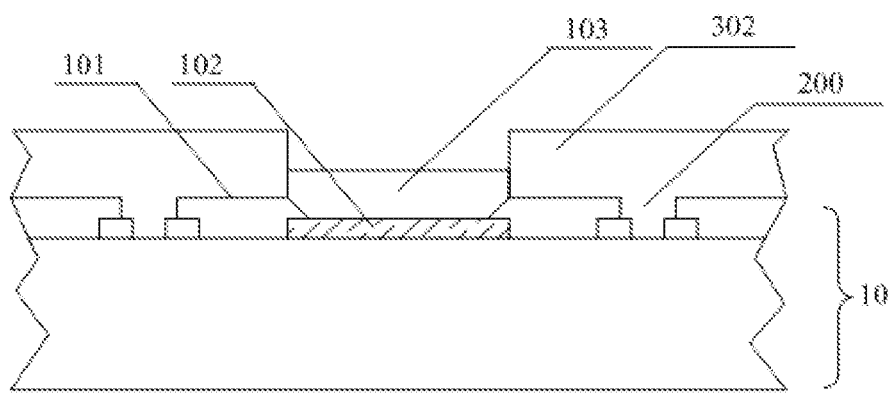

Referring to FIG. 14, after forming the photoresist mask 302, the area where the metal electrode will be formed on the semi-packaged wafer 10 is exposed, that is, the metal pad 102 in the opening of the protective mask 101 is exposed. By using the photoresist mask 302 as an electroplating mask, a non-electrolytic electroplating process is performed to form a metal electrode 103 on the metal pad 102.

Specifically, the wafer surface is treated using zincate, to remove oxide film on the metal pad 102 to decrease a contact resistance. Then, by putting the wafer into corresponding electroless plating solution successively, a non-electrolytic plating is performed step by step, for example, plating nickel, then plating gold is performed to form the metal electrode 103 protruding from the wafer. In some embodiments, the nickel may be plated to a thickness of 3 μm, and the gold may be plated to a thickness of 0.05 μm.

During the above plating process, the photoresist may not react with the zincate or the electrolyte. The plating precipitation of metal may not occur, because the wafer surface except for the area where the metal pad 102 locates, especially the dicing street 200, are covered by the photoresist mask 302. In this way, a selective plating process according to the present disclosure is achieved.

Figure 15:
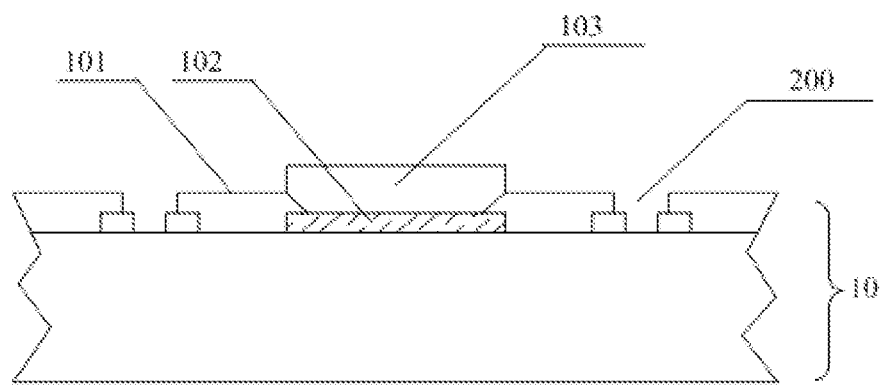

Referring to FIG. 15, the photoresist mask 302 is removed.

Specifically, an ashing process may be used to remove the photoresist mask 302, which may include: feeding oxygen into the, and heating at a temperature ranging from 100° C. to 250° C. for about 30 seconds to about 60 seconds, to remove the photoresist mask 302.

Referring to FIG. 8, step S204 is performed.

Figure 16:
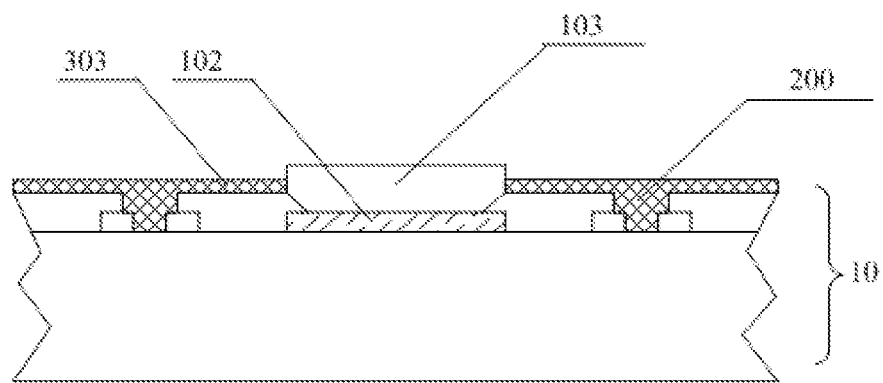

Referring to FIG. 16, a screen print process is used to form a protective layer 303 in area outside the metal electrode 103 on the wafer, the protective layer covering the dicing street 200.

The protective layer 303 may employ a thermosetting resin described above. For example, to decrease cost of production, thermosetting epoxy resin may be employed. By adjusting an opening in a screen printing plate used in the screen print process, the location of forming the protective layer 303 can be defined.

Figure 17:
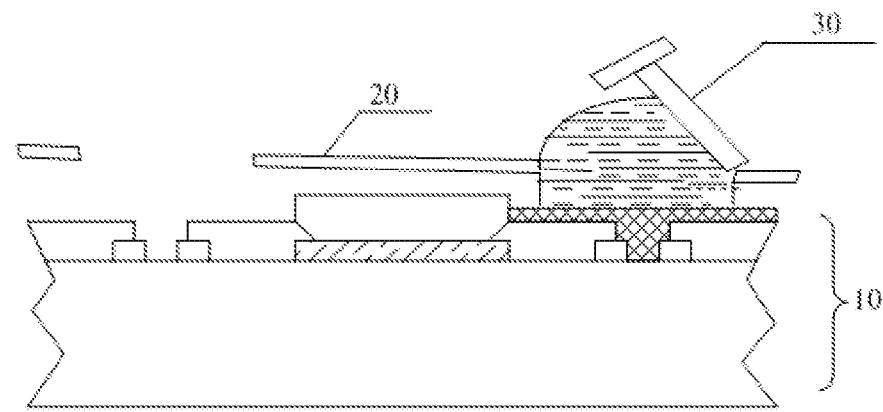

Specifically, a screen print process is illustrated schematically in FIG. 17, which may include: fixing the wafer 10 at a bottom of a screen printing plate 20 of a printing device; coating a liquid epoxy resin on the screen printing plate 20; pressing the screen printing plate 20 and the wafer 10 using a scraper 30, to make the liquid epoxy resin coat the wafer surface through the opening of the screen printing plate 20; and uncovering the screen printing plate 20 from the wafer 10. In this way, the liquid epoxy resin is transferred onto the wafer 10 to form a required pattern.

In some embodiments, the protective layer 303 is a thin film with a thickness ranging from 5 μm to 50 μm. To ensure a uniform thickness, fluidity of the thermosetting epoxy resin should be maintained during the screen print process, That is, the wafer's temperature should be maintained lower than solidification temperature of the thermosetting epoxy resin.

To decrease complexity of manufacturing, the solidification temperature of the epoxy resin used in the first embodiment is lower than 200° C. Generally, in order to improve solidification performance of the epoxy resin, a solidified filler, such as silica or other solid particles, may be included in the epoxy resin. The solidified filler may have a particle diameter less than one third of the thickness of the printing layer, so as to achieve requirements of uniformity and flatness of the screen printing, and decrease surface warping of the wafer 10. The thickness to be printed may be controlled by adjusting a thickness of emulsion on the screen printing plate 20. In some embodiments, during a screen print process, if the liquid epoxy resin is printed to 15 μm and the solidified filler has a particle diameter no more than 5 μm, an average thickness of the protective layer 303 formed by solidifying the epoxy resin can be controlled in a range from 11 μm to 12 μm.

Because of fluidity of the liquid epoxy resin, it is unavoidable that the liquid epoxy resin may penetrate into the area where the metal electrode 103 locates. Thus a problem is introduced. When forming a solder ball on the metal electrode 103, the epoxy resin locating on the surface of the metal electrode 103 would reduce a contact area between the solder ball and the metal electrode 103, which thereby hinder a combination between the solder ball and the metal electrode 103. More seriously, the solder ball may fall off during a reliability test or a drop test after being packaged. Therefore, it is desirable to remove the above mentioned residuals by polishing the wafer surface.

Figure 18:
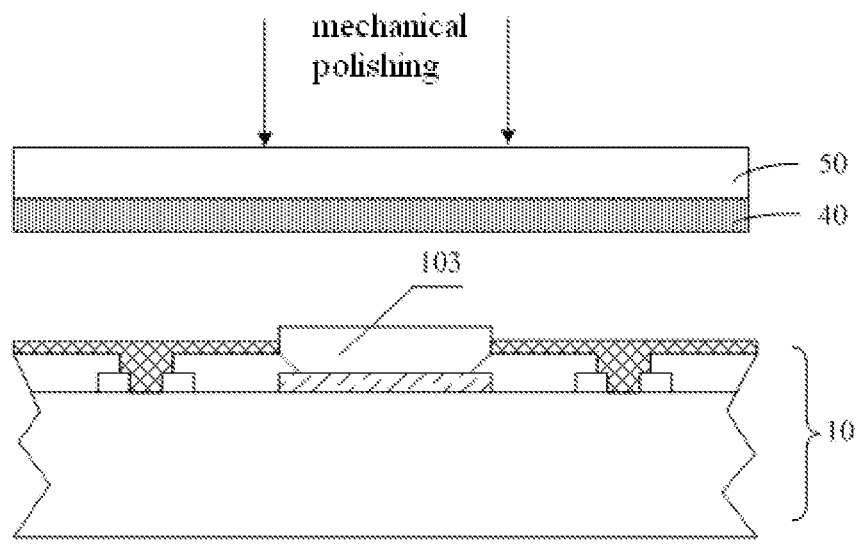

The polishing may be a mechanical or chemical polishing. Referring to FIG. 18, the polishing process may include: fixing the wafer 10 on an operation table; winding a nonwovens with a hardness lower than the wafer around a polishing pad 50, the nonwovens facing the wafer 10 surface closely; immersing the nonwovens 40 into a polishing solution and polishing the wafer 10, to remove the residuals attached to the wafer surface.

Figure 19:
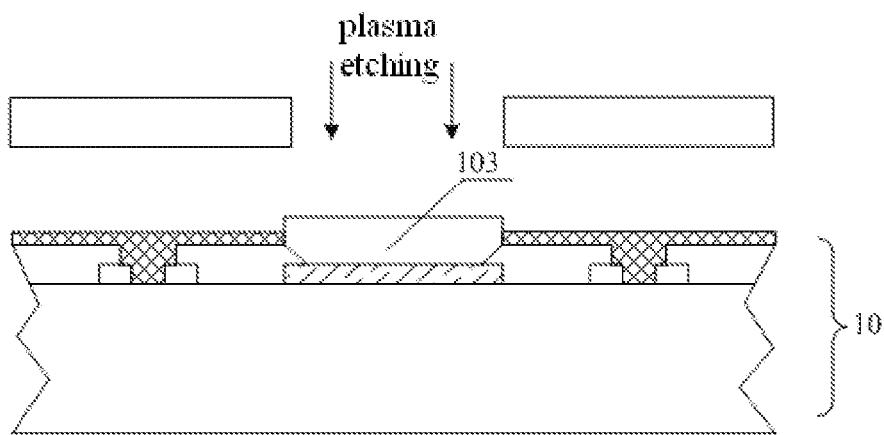

Optionally, after polishing, a plasma etch process may be used to farther remove the epoxy resin covering the top surface of the metal electrode 103, which is shown in FIG. 19. The etching gas may include oxygen, which may react with the solidified epoxy resin to generate a gas to be removed.

Referring to FIG. 8, step S205 is performed.

Figure 20:
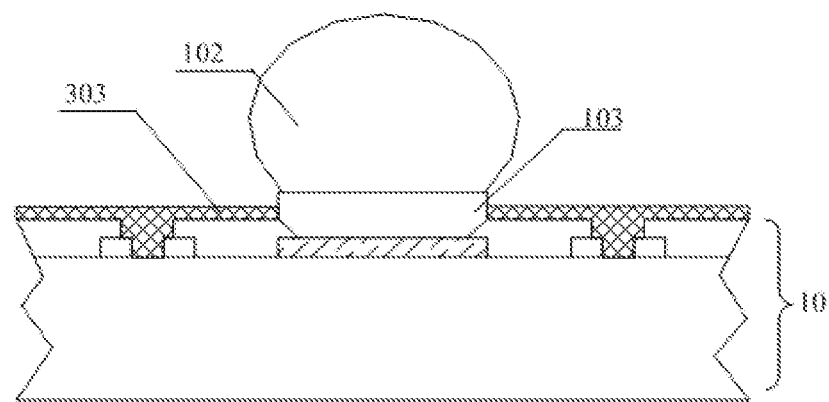

Referring to FIG. 20, a solder ball 104 is formed on the top surface of the metal electrode 103 using a solder reflux process. In some embodiments, to reduce cost of production, tin is employed as a solder material. The solder reflux process may include: coating a tin solder material covering the top surface of the metal electrode 103; then performing a high temperature reflux to transform the tin solder material into a solder ball 104. Generally, to ensure a flatness of the wafer surface and to enhance a insulation protection, an underfill process may be performed on the wafer surface where the solder ball 104 is not located.

Referring to FIG. 8, step S206 is performed.

Figure 21:
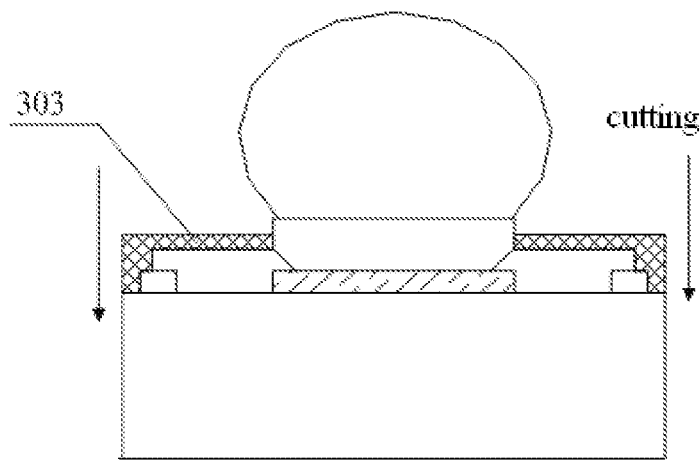

Referring to FIG. 21, after firming the solder ball, the wafer 10 is diced into individual chips along the dicing street 200. Specifically, a blade with its width less than that of the dicing street 200 is used to dice the wafer mechanically. In this way, after being cut, the side surface, the top edge and the top surface of the individual chips are covered with the protective layer 303. As a result, the metal wires or other semiconductor structures formed thereon can be protected effectively.

The individual chips are encapsulated to finish the packaging process of the present disclosure.

Embodiment Two

Figure 22:
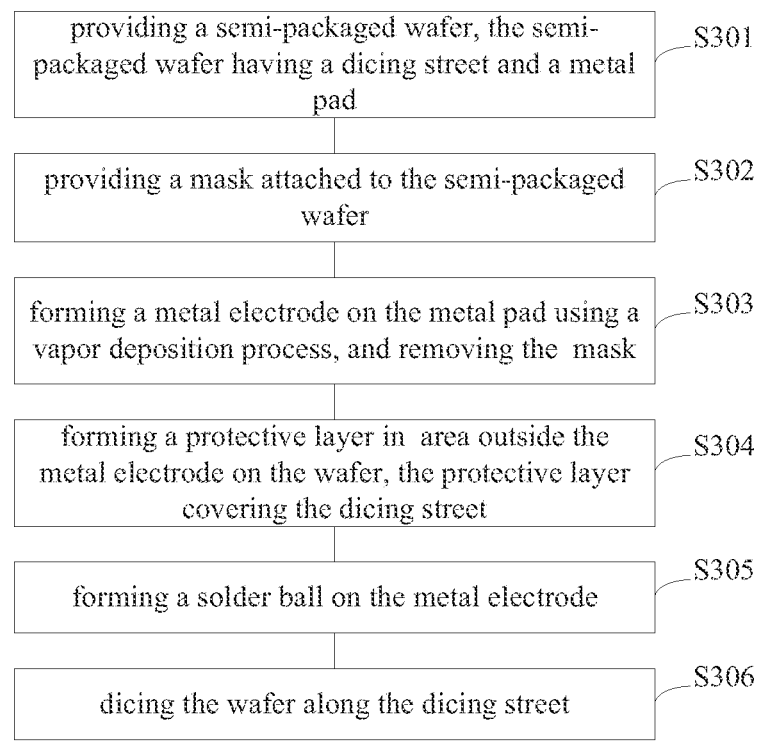
FIG. 22 schematically illustrates a flow chart according to a second embodiment of the present disclosure.
Figure 23:
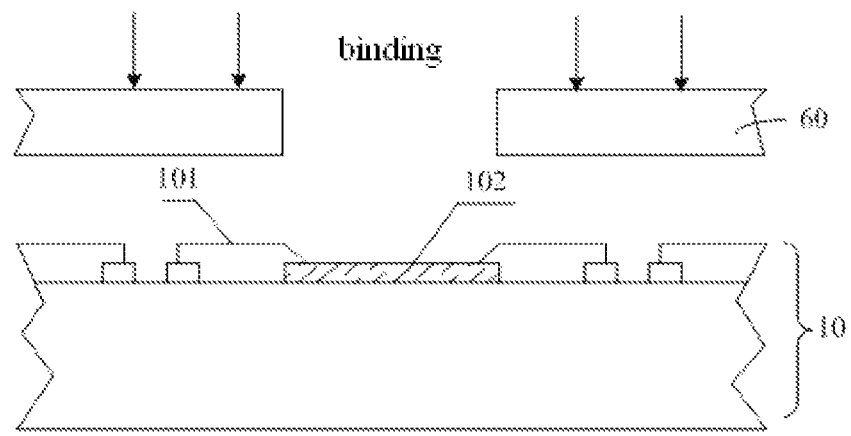
FIG. 23 and FIG. 24 schematically illustrate a cross-sectional view of some of steps shown in FIG. 22.
Figure 24:
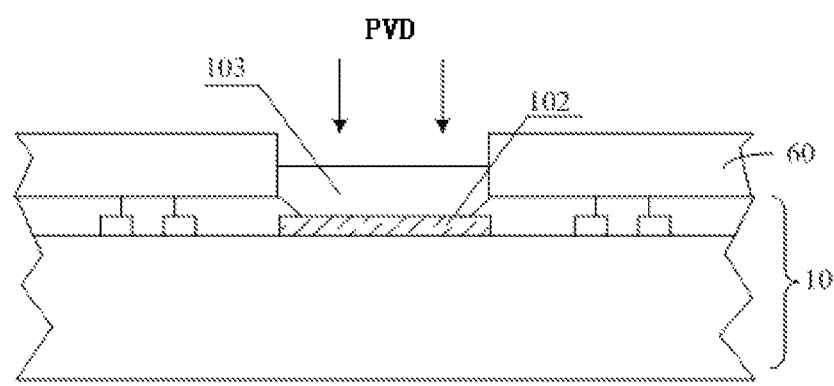

FIG. 22 schematically illustrates a flow chart according to a second embodiment of the present disclosure. FIG. 23 and FIG. 24 schematically illustrate cross-sectional views of some steps shown in FIG. 22. Hereinafter, the second embodiment may be described in detail with reference to FIG. 22.

Referring to FIG. 22, step S301 is performed.

A semi-packaged wafer is provided. The semi-packaged wafer may include: a semiconductor substrate with a chip formed thereon, a dicing street for dicing the wafer into a plurality of individual chips, a protective mask which is formed on the semiconductor substrate and has an opening, and a metal pad which is exposed front the opening. The step S301 is similar to the step S201 in the first embodiment, which may refer to FIG. 9 and FIG. 10.

Referring to FIG. 22, step S302 is performed.

Referring to FIG. 23, a mask 60 is provided on the wafer 10. The mask 60 may be a hard mask made of metal, glass or other material. The mask 60 is put on the wafer 10 closely. The mask 60 has an opening which is aligned with the opening of the protective mask 101 on the wafer 10. That is, the metal pad on the chip is exposed from the opening of the mask 60.

In some embodiments, the mask 60 may be a copper mask. In order to achieve good adhesion and sealing properties between the mask 60 and the wafer 10, the wafer 10 may be coated an organic or inorganic lubricant firstly before bonding the mask 60 to the wafer 10. The lubricant can prevent a gas entering into a gap between the mask 60 and the wafer 10 during the subsequent vapor deposition, resulting in undesired metal formed on the wafer surface outside the opening.

Referring to FIG. 22, step S303 is performed.

Referring to FIG. 24, the mask 60 and the wafer 10 is put into a deposition chamber. By using a physical vapor deposition, a nickel deposition and a copper deposition are performed successively, to form a metal electrode 103. Due to the mask 60, the above metal is deposited only in the opening of the protective mask 101. That is, the metal is deposited only in a location where the metal electrode is desired to be formed. Thus, a selective deposition is achieved.

Because locations of the metal electrode to be formed are the same when the wafer in a same lot is packaged, the mask 60 can be used repeatedly. It is economical compared with the first embodiment. In addition, compared with a non-electrolytic electroplating process, it is fast-deposition and short-time by using vapor deposition to form the metal electrode 103.

After the metal electrode 103 is formed, the mask 60 is removed.

In S304 screen print process is used to form a protective layer 303 in area outside the metal electrode 103 on the wafer, the protective layer covering the dicing street 200. In S305, a solder ball 104 is formed on the top surface of the metal electrode 103 using a solder reflux process. In S306, the wafer 10 is diced into individual chips along the dicing street 200.

The above steps S304 to S306 are similar to the steps S204 to S206, respectively, and are not described in detail herein.

Further, in some embodiments, before performing a screen print process, the wafer 10 may be baked, or be treated using plasma for activating its surface, to improve adhesion strength of the thermosetting resin.

Although the present disclosure has been disclosed, above with reference to preferred embodiments thereof, it should be understood, that the disclosure is presented by way of example only, and not limitation. Those skilled in the art can modify and vary the embodiments without departing from the spirit and scope of the present disclosure.

What is claimed is:

1. A method for chip package, comprising:
    providing a semi-packaged wafer, the semi-packaged wafer having a dicing street and a metal pad;
    selectively forming a metal electrode on the metal pad;
    forming a protective layer in area outside the metal electrode on the wafer, the protective layer covering the dicing street, where the protective layer is made of a cured thermosetting epoxy resin comprising a solidified filler which has a particle diameter less than one third of the thickness of the thermosetting epoxy resin before the thermosetting epoxy resin is cured, and wherein the solidified filler has a particle diameter greater than one third of the thickness of the thermosetting epoxy resin after the thermosetting epoxy resin is cured, and wherein the solidified filler is silica solid particles;
    forming a solder ball on the metal electrode; and
    dicing the wafer along the dicing street.

2. The method according to claim 1, where the selective forming process is a selective plating process.

3. The method according to claim 2, where the selective plating process comprises: forming a first mask layer on the wafer, exposing an area the metal electrode to be formed; cleaning the wafer using zincate; with the first mask layer protection, plating nickel and gold successively on the wafer using a non-electrolytic plating process; and removing the first mask layer.

4. The method according to claim 3, where the nickel is plated to a thickness of 3 μm, and the gold is plated to a thickness of 0.05 μm.

5. The method according to claim 3, where the first mask layer is a photoresist mask.

6. The method according to claim 1, where the selective forming step is a selective vapor deposition process.

7. The method according to claim 6, where the selective vapor deposition process comprises: providing a second mask on the wafer, exposing an area the metal electrode to be formed; with the second mask protection, depositing nickel and gold successively on the wafer using a physical vapor deposition process;
    and removing the second mask.

8. The method according to claim 7, where the second mask is a metal mask.

9. The method according to claim 1, where the protective layer has a thickness ranging from 5 μm to 50 μm.

10. The method according to claim 1, where the protective layer is made of thermosetting epoxy resin, which is formed using a screen print process.

11. The method according to claim 10, further comprising a plasma etching to remove the thermosetting epoxy resin covering the top surface of the metal electrode after the protective layer is formed.

12. The method according to claim 10, where during a screen print process, the wafer's temperature is maintained lower than solidification temperature of the thermosetting epoxy resin.

13. The method according to claim 10, where the solidification temperature of the thermosetting epoxy resin is lower than 200° C.

14. The method according to claim 1, where the thermosetting epoxy resin is printed to 15 μm, the solidified filler has a particle diameter no more than 5 μm, and an average thickness of the protective layer formed by solidifying the epoxy resin ranges from 11 μm to 12 μm.

15. The method according to claim 10, before performing a screen print process, the wafer is baked, or is treated using plasma for activating its surface.

16. The method according to claim 1, further comprising polishing the wafer surface after the protective layer is formed.

17. The method according to claim 16, where a mechanical polishing is employed, which comprises: fixing the wafer on an operation table; winding a nonwoven layer with a hardness lower than the wafer around a polishing pad, the nonwovens facing the wafer surface closely; immersing the nonwovens into a polishing solution and polishing the wafer.

* * * * *